United States Patent
Hsiao et al.

(10) Patent No.: US 10,008,501 B2
(45) Date of Patent: Jun. 26, 2018

(54) SANDWICH EPI CHANNEL FOR DEVICE ENHANCEMENT

(71) Applicant: Taiwan Semiconductor Manufacturing Co., Ltd., Hsin-Chu (TW)

(72) Inventors: Ru-Shang Hsiao, Jhubei (TW); Ling-Sung Wang, Tainan (TW); Chih-Mu Huang, Tainan (TW); Cing-Yao Chan, Keelung (TW); Chun-Ying Wang, Tainan (TW); Jen-Pan Wang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/267,328

(22) Filed: Sep. 16, 2016

(65) Prior Publication Data

US 2017/0005095 A1    Jan. 5, 2017

Related U.S. Application Data

(62) Division of application No. 14/205,911, filed on Mar. 12, 2014, now Pat. No. 9,466,670.

(51) Int. Cl.
*H01L 29/778* (2006.01)
*H01L 27/092* (2006.01)
(Continued)

(52) U.S. Cl.
CPC .... *H01L 27/0928* (2013.01); *H01L 21/02381* (2013.01); *H01L 21/02529* (2013.01);
(Continued)

(58) Field of Classification Search
None
See application file for complete search history.

(56) References Cited

U.S. PATENT DOCUMENTS

| 6,111,267 A | 8/2000 | Fischer et al. |
| 6,399,970 B2 * | 6/2002 | Kubo .................. H01L 21/8238 257/192 |

(Continued)

FOREIGN PATENT DOCUMENTS

JP    2013055274 A    3/2013

OTHER PUBLICATIONS

Notice of Allowance dated Oct. 11, 2016 in connection with Japanese Patent Application No. 10-2014-0168575.
(Continued)

*Primary Examiner* — Ali Naraghi
(74) *Attorney, Agent, or Firm* — Eschweiler & Potashnik, LLC

(57) ABSTRACT

The present disclosure relates to a transistor device having a channel region comprising a sandwich film stack with a plurality of different layers that improve device performance, and an associated apparatus. In some embodiments, the transistor device has a source region and a drain region disposed within a semiconductor substrate. A sandwich film stack is laterally positioned between the source region and the drain region. The sandwich film stack has a lower layer, a middle layer of a carbon doped semiconductor material disposed over the lower layer, and an upper layer disposed over the middle layer. A gate structure is disposed over the sandwich film stack. The gate structure is configured to control a flow of charge carriers in a channel region located between the source region and the drain region.

20 Claims, 6 Drawing Sheets

(51) Int. Cl.
   *H01L 29/10* (2006.01)
   *H01L 29/66* (2006.01)
   *H01L 29/78* (2006.01)
   *H01L 29/165* (2006.01)
   *H01L 29/16* (2006.01)
   *H01L 29/161* (2006.01)
   *H01L 21/02* (2006.01)
   *H01L 21/306* (2006.01)
   *H01L 21/8238* (2006.01)
   *H01L 29/06* (2006.01)

(52) U.S. Cl.
   CPC .. *H01L 21/02532* (2013.01); *H01L 21/02694* (2013.01); *H01L 21/30604* (2013.01); *H01L 21/823807* (2013.01); *H01L 29/0653* (2013.01); *H01L 29/1054* (2013.01); *H01L 29/161* (2013.01); *H01L 29/165* (2013.01); *H01L 29/1608* (2013.01); *H01L 29/66545* (2013.01); *H01L 29/66575* (2013.01); *H01L 29/66651* (2013.01); *H01L 29/7842* (2013.01)

(56) References Cited

U.S. PATENT DOCUMENTS

| | | | |
|---|---|---|---|
| 7,387,925 B2 * | 6/2008 | Shang | H01L 21/823807 257/E21.092 |
| 7,449,379 B2 | 11/2008 | Ochimizu et al. | |
| 7,495,291 B2 * | 2/2009 | Chidambarrao | H01L 21/823807 257/338 |
| 7,928,427 B1 * | 4/2011 | Chang | H01L 21/8258 257/24 |
| 8,518,768 B2 * | 8/2013 | Datta | H01L 21/823807 257/192 |
| 8,816,391 B2 * | 8/2014 | Ko | H01L 29/1054 257/192 |
| 8,822,282 B2 | 9/2014 | Fitzgerald | |
| 2001/0003364 A1 | 6/2001 | Sugawara et al. | |
| 2005/0009263 A1 | 1/2005 | Yeo et al. | |
| 2012/0319166 A1 | 12/2012 | Adam et al. | |
| 2015/0035055 A1 | 2/2015 | Wang | |

OTHER PUBLICATIONS

Non-Final Office Action dated Jun. 18, 2015 for U.S. Appl. No. 14/205,911.

Non-Final Office Action dated Jan. 14, 2016 for U.S. Appl. No. 14/205,911.

Notice of Allowance dated Jun. 9, 2016 for U.S. Appl. No. 14/205,911.

* cited by examiner

SANDWICH EPI CHANNEL FOR DEVICE ENHANCEMENT

REFERENCE TO RELATED APPLICATION

This Application is a Divisional of U.S. application Ser. No. 14/205,911 filed on Mar. 12, 2014, the contents of which is hereby incorporated by reference in its entirety.

BACKGROUND

Modern day integrated chip circuits comprise millions or billions of transistor devices. Often, the transistor devices comprise field effect transistors used for amplifying or switching electronic signals and/or to provide functionality to integrated chip circuits. Field effect transistors comprise a source region and a drain region separated by a channel region. A gate structure, located between the source and drain regions, is configured to control the flow of charge carriers (e.g., holes or electrons) in the channel region. While transistors may be formed using various techniques and materials, they require accurate and precise placement of their various components and constituents to operate optimally and efficiently, especially as dimensions continue to shrink to meet advanced integration requirements. One such constituent is the dopant impurities that are introduced into the channel region because they directly influence the functionality and performance of the transistor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
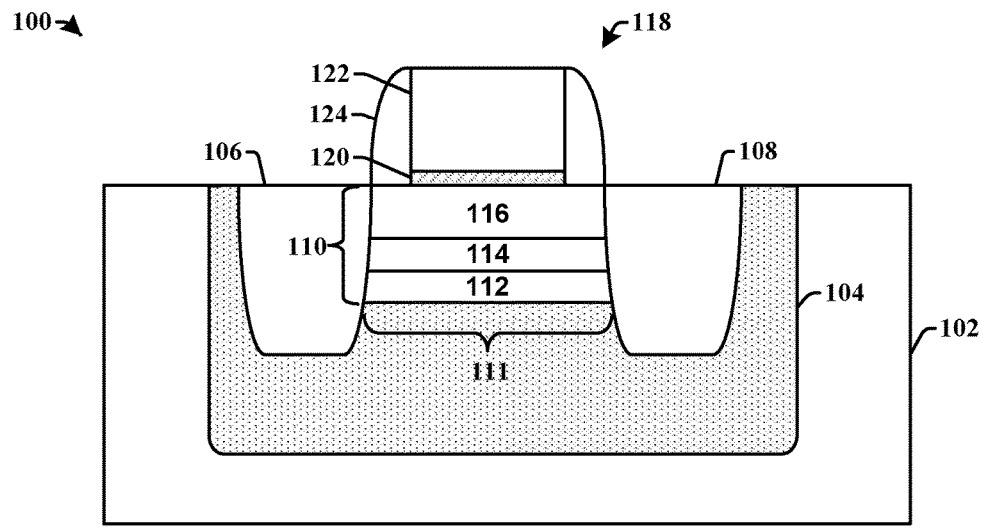
FIG. 1 illustrates a cross-sectional view of some embodiments of a transistor device having a channel region comprising a sandwich film stack with a plurality of different layers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Over the past few decades the semiconductor industry has made continual advances in manufacturing technology (e.g., photolithography), which have allowed for a steady reduction in transistor device size. Decreasing the size of a transistor device while keeping a power density constant improves the performance of the transistor. However, in recent years, as scaling has begun to reach the physical limitations of materials, scaling has begun to cause a number of problems with transistor devices.

For example, as transistor gate lengths continue to decrease, local and global variations of transistor threshold voltages have become worse. For example, during fabrication of an integrated chip, a plurality of separate processing operations are used to form structural features of transistor devices. Such processing operations may introduce dopant impurities into a transistor channel that may cause variations in the threshold voltages of transistor devices and therefore performance degradation. Such threshold voltage variations may be made worse when pocket implantation dose is increased to improve short-channel control of transistor devices.

Accordingly, the present disclosure relates to a method of forming a transistor device having a channel region comprising a sandwich film stack with a plurality of different layers, which are configured to improve device performance (e.g., improve threshold voltage variations, mobility, etc.), and an associated apparatus. In some embodiments, the method comprises selectively etching a semiconductor substrate to form a recess along a top surface of the semiconductor substrate. A sandwich film stack comprising a plurality of nested layers is formed within the recess. At least two of the nested layers comprise different materials configured to improve different aspects of the performance of the transistor device. A gate structure is formed over the sandwich film stack. The gate structure is configured to control the flow of charge carriers in a channel region comprising the sandwich film stack, which is laterally positioned between a source region and a drain region disposed within the semiconductor substrate. By forming a channel region comprising the sandwich film stack, performance of the transistor device can be improved.

FIG. 1 illustrates a cross-sectional view of some embodiments of a transistor device 100 having a channel region comprising a sandwich film stack with a plurality of different layers.

The transistor device 100 comprises a source region 106 and a drain region 108. The source region 106 and the drain region 108 are highly doped regions that may have a doping concentration in a range of between $10^{16}$ cm$^{-3}$ and $10^{19}$ cm$^{-3}$, for example. In some embodiments, source region 106 and the drain region 108 may be disposed within a well region 104 located within a semiconductor substrate 102 (e.g., a silicon substrate). The well region 104 has a doping type that is different than that of the semiconductor substrate 102. For example, the semiconductor substrate 102 may have an intrinsic first doping type (e.g., p-type doping), while the well region 104 may have a second doping type (e.g., n-type doping) different than the first doping type.

A sandwich film stack 110 comprising a plurality of different layers 112-116 is laterally disposed between the source and drain regions, 106 and 108, along a top surface of the semiconductor substrate 102. The sandwich film stack 110 comprises a channel region 111, which extends between the source region 106 and the drain region 108. The plurality of different layers 112-116 comprise materials selected to improve different aspects of the performance of transistor device 100.

In some embodiments, the plurality of different layers 112-116 may comprise three different layers: a lower layer 112, a middle layer 114, and an upper layer 116. In such embodiments, at least two of the different layers may comprise different materials selected to improve different aspects of the performance of transistor device 100. For example, the upper layer 116 may comprise a first material configured to improve mobility in the channel region 111, the middle layer 114 may comprise a second material configured to prevent back diffusion of dopants into the upper layer 116 of the channel region 111, and the lower layer 112 may comprise a third material configured to provide a dopant concentration gradient between the well region 104 and the channel region 111. In some embodiments, the plurality of different layers 112-116 may vary depending on a doping type of the well region 104. For example, a well region 104 having a first doping type will have a first set of materials, while a well region 104 having a second doping type will have a second set of materials.

A gate structure 118 configured to control the flow of charge carriers between the source region 106 and the drain region 108 is disposed onto the semiconductor substrate 102 at a position vertically overlying the sandwich film stack 110. In some embodiments, the gate structure 118 may comprise a gate dielectric layer 120 and an overlying gate electrode layer 122. The gate dielectric layer 120 (e.g., a silicon dioxide layer, a high-k dielectric layer, etc.) is disposed onto the sandwich film stack 110. The gate electrode layer 122 (e.g., a poly-silicon layer, a replacement metal gate layer, etc.) is disposed onto the gate dielectric layer 120. In some embodiments, the gate structure 118 may further comprise sidewall spacers 124 located at positions flanking the gate dielectric layer 120 and a gate electrode layer 122.

Figure 2:
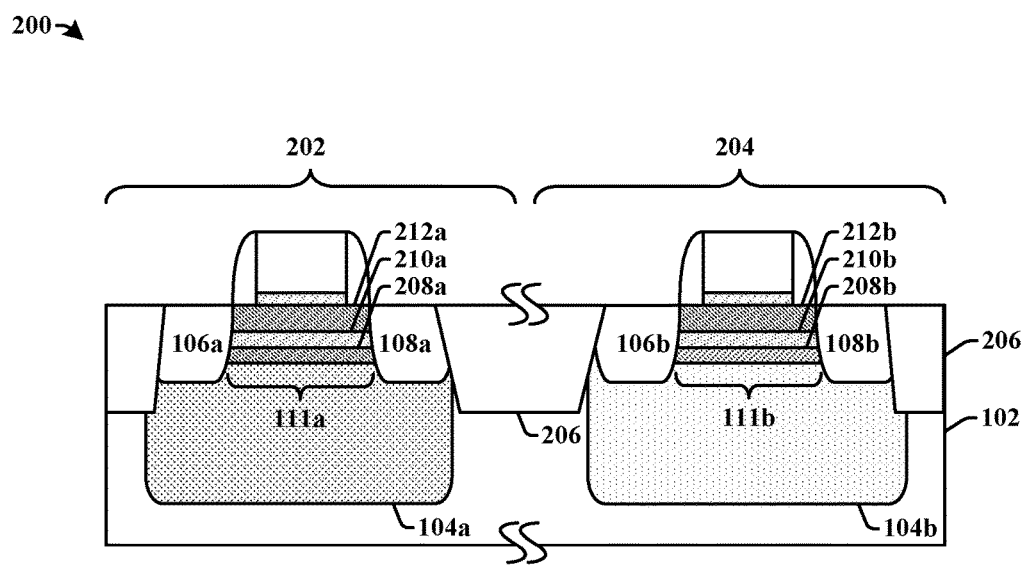
FIG. 2 illustrates a cross-sectional view of some embodiments of an integrated chip having transistor devices comprising a channel region with a sandwich epitaxial stack having a plurality of epitaxial layers.

FIG. 2 illustrates a cross-sectional view of some embodiments of an integrated chip 200 comprising transistor devices having channel regions with sandwich epitaxial film stacks.

The integrated chip 200 has a first transistor device 202 and a second transistor device 204. The first transistor device 202 comprises a first channel region 111a having a first sandwich epitaxial film stack disposed between a first source region 106a and a first drain region 108a. The second transistor device 204 comprises a second channel region 111b having a second sandwich epitaxial film stack disposed between a second source region 106b and a second drain region 108b. The first and second transistor devices, 202 and 204, are different transistor types (e.g., NMOS or PMOS), such that the first channel region 111a and the second channel region 111b have different doping types. For example, in some embodiments, the first transistor device 202 may comprise a PMOS transistor device having a first channel region 111a with an n-type doping, while the second transistor device 204 may comprise an NMOS transistor device having a second channel region 111b with a p-type doping. In some embodiments, isolation structures 206 (e.g., shallow trench isolation (STI)) configured to prevent current leakage between the first transistor device 202 and the second transistors device 204 may be disposed within the semiconductor substrate 102.

In some embodiments, the first and second epitaxial film stacks may comprise three epitaxial layers. For example, the first epitaxial film stack may comprise a lower epitaxial layer 208a disposed within a first recess in the semiconductor substrate 102, a middle epitaxial layer 210a disposed onto the lower epitaxial layer 208a, and an upper epitaxial layer 212a disposed onto the middle epitaxial layer 210a. Similarly, the second epitaxial film stack may comprise a lower epitaxial layer 208b disposed within a second recess in the semiconductor substrate 102, a middle epitaxial layer 210b disposed onto the lower epitaxial layer 208b, and an upper epitaxial layer 212b disposed onto the middle epitaxial layer 210b.

The materials of the sandwich epitaxial film stacks are configured to improve performance of the transistors devices 202 and 204. For example, in some embodiments, the middle epitaxial layer 210 may be selected to comprise a silicon carbide layer configured to mitigate dopant back diffusion from the semiconductor substrate 102 (or a well region 104 within the semiconductor substrate 102) to the upper epitaxial layer 212, resulting in a channel region 111 having a steep retrograde doping concentration profile (a doping profile of doping concentration profile having a steep slope in a region corresponding to the middle and upper epitaxial layers, 210 and 212). The retrograde doping concentration profile results in a low doping concentration (e.g., less than 1e18 cm $^{-3}$) at the top surface of the sandwich epitaxial film stacks, which augments performance (e.g., improves local and global threshold voltage and drive current variations within the device) of the transistor devices, 202 and 204.

In other embodiments, the upper epitaxial layer 212 may be selected to comprise a material that improves the mobility of the transistor devices, 202 and 204. For example, a PMOS transistor device may be configured to have a sandwich epitaxial film stack having an upper epitaxial layer 212 of silicon germanium. An upper epitaxial layer 212 of silicon germanium improves the mobility of the PMOS transistor device since the lattice constant of silicon germanium strains the channel region 111, which enhances charge carrier mobility within the channel region 111.

In some embodiments, since the first and second transistor devices, 202 and 204, comprise different transistor types, the first and second sandwich epitaxial film stacks may have different materials (e.g., one or more of the epitaxial layers within the sandwich epitaxial film stacks may be different materials depending on whether a transistor device is a PMOS or an NMOS device). For example, in some embodiments, wherein the first transistor device 202 comprises a PMOS transistor, the lower epitaxial layer 208a is a silicon layer, the middle epitaxial layer 210a is a silicon carbide (SiC) layer, and the upper epitaxial layer 212a is a lightly doped silicon germanium (SiGe) layer. In some embodiments, wherein the second transistor device 204 comprises an NMOS transistor, the lower epitaxial layer 208b is a silicon layer, the middle epitaxial layer 210b is a silicon carbide (SiC) layer, and the upper epitaxial layer 212b is a lightly doped silicon layer.

Figure 3:
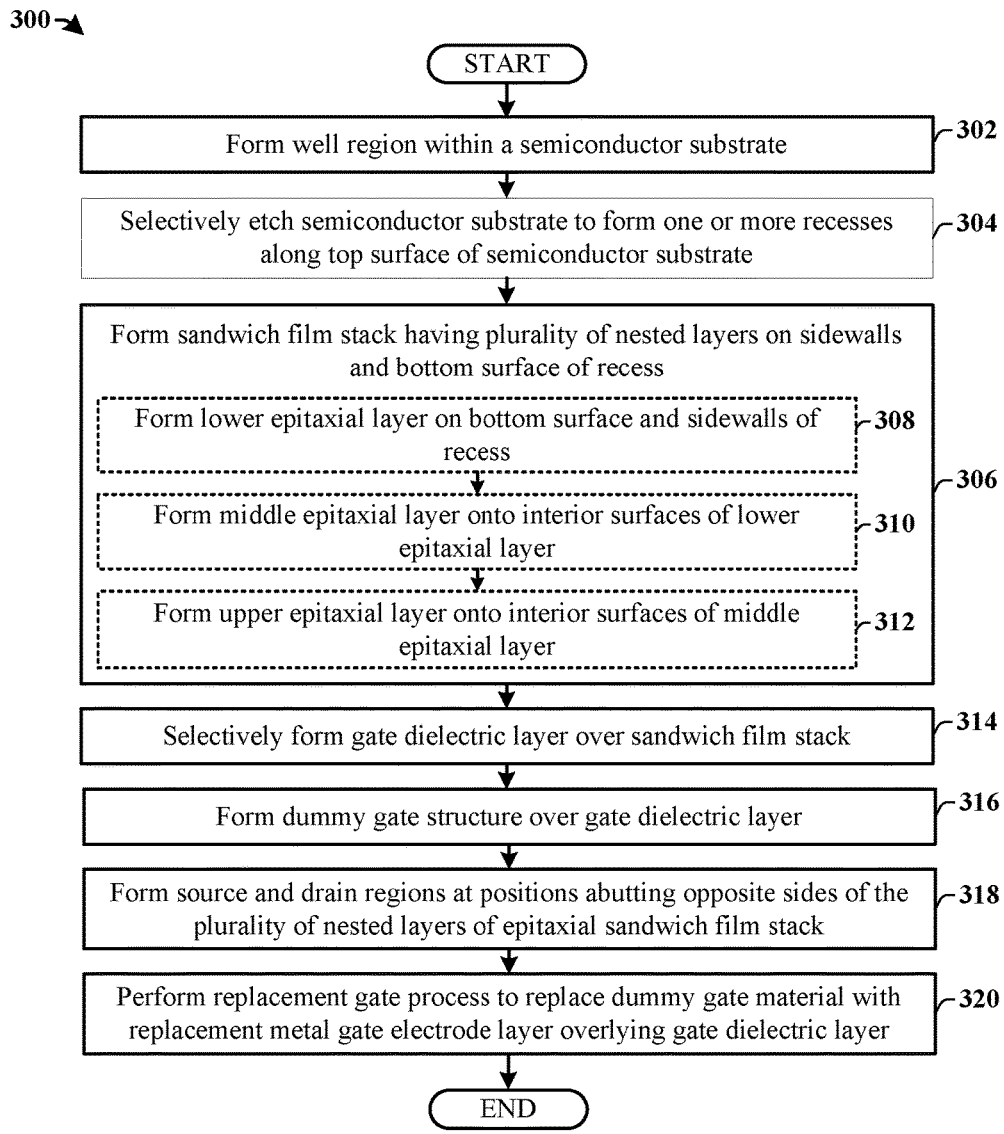
FIG. 3 illustrates a flow diagram of some embodiments of a method of forming a transistor device having a channel region comprising a sandwich film stack with a plurality of different layers.

FIG. 3 illustrates a flow diagram of some embodiments of a method 300 of forming a transistor device having a channel region comprising a sandwich film stack with a plurality of different layers.

While method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a well region may be formed within a semiconductor substrate. In some embodiments, the well region may be formed by performing a well implantation process to introduce dopants into a semiconductor substrate. In some embodiments, a well anneal process may be performed on the semiconductor substrate after the well implantation process to activate dopants introduced by the well implantation process.

At 304, the semiconductor substrate is selectively etched to form a recess within a top surface of the semiconductor substrate. In some embodiments, the recess may be located within the well region along the top surface of the semiconductor substrate.

At 306, a sandwich film stack is formed on sidewalls and bottom surface of the recess. The sandwich film stack comprises a plurality of nested layers.

In some embodiments, the sandwich film stack may comprise a sandwich epitaxial film stack having plurality of nested epitaxial layers formed by performing a plurality of epitaxial growth processes. For example, in some embodiments, the sandwich epitaxial film stack may comprise three nested epitaxial layers. In such embodiments, a lower epitaxial layer is formed onto interior surfaces (i.e., a bottom surface and sidewalls) of the recess, at 308. A middle epitaxial layer is formed onto interior surfaces (i.e., a top surface and sidewalls) of the lower epitaxial layer, at 310. An upper epitaxial layer is formed onto interior surfaces (i.e., a top surface and sidewalls) of the middle epitaxial layer, a 312. By forming an epitaxial layer onto the interior surfaces of another epitaxial layer, the three epitaxial layers have different sizes that allow a smaller epitaxial layer to fit into a larger epitaxial layer.

At 314, a gate dielectric layer is selectively formed over the sandwich film stack.

At 316, a dummy gate structure is formed over the gate dielectric layer.

At 318, source and drain regions are formed within the semiconductor substrate at positions abutting opposite sides of the plurality of nested layers of the sandwich film stack. In some embodiments, the source and drain regions may be formed by an implantation process. In other embodiments, the source and drain regions may be comprise epitaxial source and drain regions. In such embodiments, the epitaxial source and drain regions are formed by selectively etching the semiconductor substrate to form source and drain cavities abutting the plurality of nested layers, and subsequently depositing epitaxial material within the source and drain cavities.

At 320, a replacement gate process is performed to replace the dummy gate structure with a gate dielectric layer and an overlying replacement metal gate electrode layer. In various embodiments, the dummy gate structure may be removed by a wet etching process and/or a dry etching process. In various embodiments, the gate dielectric layer may comprise an inter-layer gate dielectric layer or a high-k gate dielectric layer formed by a deposition technique.

FIGS. 4-10 illustrate some embodiments of cross-sectional views of a semiconductor substrate showing a method of forming a transistor device having a channel region comprising a sandwich film stack with a plurality of different layers. Although FIGS. 4-10 are described in relation to method 300, it will be appreciated that the structures disclosed in FIGS. 4-10 are not limited to such a method.

Figure 4:
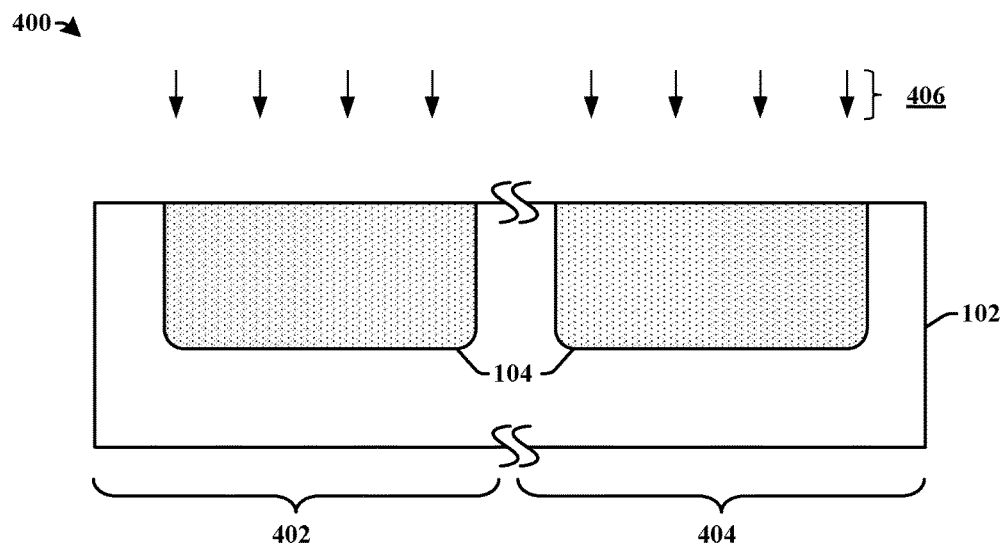
FIGS. 4-10 illustrate some embodiments of cross-sectional views of a semiconductor substrate showing a method of forming a transistor device having a channel region comprising a sandwich film stack with a plurality of different layers.

FIG. 4 illustrates a cross-sectional view 400 of some embodiments of a semiconductor substrate corresponding to act 302.

As shown in cross-sectional view 400, well regions 104 are formed within a semiconductor substrate 102. In some embodiments, the well regions 104 may be formed by performing a well implantation process 406 (i.e., a Vt implantation process) on the semiconductor substrate 102. The well implantation process 406 is configured to introduce dopants into the semiconductor substrate 102 to adjust the threshold voltage that allows current to flow in a channel region. In some embodiments, the well implantation process 406 may introduce a p-type dopant (e.g., boron) into the semiconductor substrate 102, while in other embodiments the well implantation process 406 may introduce an n-type dopant (e.g., phosphorous, antimony, or arsenic) into the semiconductor substrate 102. In some embodiments, a high temperature anneal may be performed to activate the dopants implanted by the well implantation process 406.

It will be appreciated that in various embodiments, the semiconductor substrate 102 may comprise any type of semiconductor body (e.g., silicon, silicon-germanium, silicon-on-insulator) as well as any other type of semiconductor and/or epitaxial layers associated therewith. In some embodiments, the semiconductor substrate 102 may comprise an intrinsically doped semiconductor substrate having a first doping type (e.g., an n-type doping or a p-type doping). In some embodiments, the semiconductor substrate 102 may have a core region 402 and a periphery I/O region 404. The core region 402 is a region of an integrated chip comprising transistor devices configured to perform logical functions (e.g., to execute program instructions). The periphery I/O region 404 is a region of an integrated chip comprising transistor devices configured to interface with an outside world. As illustrated in FIGS. 4-10, the formation of the disclosed sandwich film stack is the same in the core and periphery I/O regions of an integrated chip.

Figure 5:
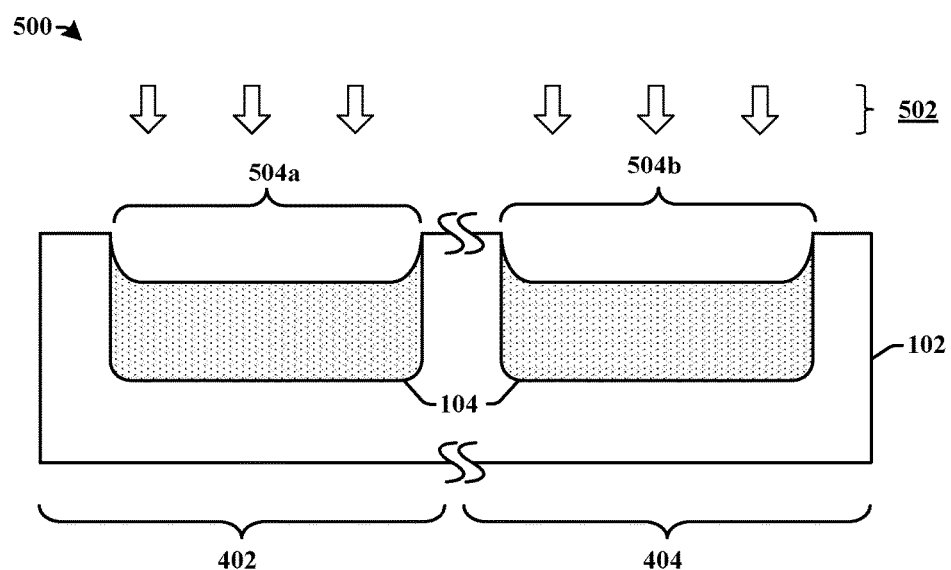

FIG. 5 illustrates a cross-sectional view 500 of some embodiments of a semiconductor substrate corresponding to act 304.

As shown in cross-sectional view 500, the semiconductor substrate 102 is exposed to an etchant 502 that is configured to form recesses, 504a and 504b, within the semiconductor substrate 102. In some embodiments, the recesses, 504a and 504b, comprise cavities located along a top surface of the well regions 104. In some embodiments, the etchant 502 may comprise a dry etchant (e.g., an ion bombardment) and/or a wet etchant (e.g., Tetramethylammonium hydroxide (TMAH), potassium hydroxide (KOH), etc.).

Figure 6:
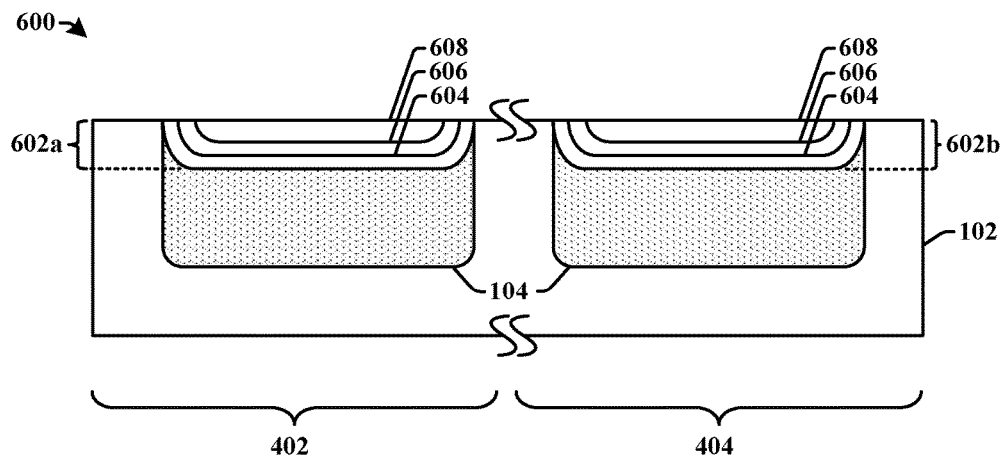

FIG. 6 illustrates a cross-sectional view 600 of some embodiments of a semiconductor substrate corresponding to act 306.

As shown in cross-sectional view 600, an epitaxial growth process is performed to form sandwich epitaxial film stacks, 602a and 602b, within the recesses, 504a and 504b. Respective sandwich epitaxial film stacks, 602a and 602b, comprise a plurality of nested epitaxial layers 604-608. In some embodiments, the sandwich epitaxial film stack 602 comprises a lower epitaxial layer 604 formed within the recesses 504, a middle epitaxial layer 606 formed onto the lower epitaxial layer 604, and an upper epitaxial layer 608 formed onto the middle epitaxial layer 606. In some embodiments, the plurality of nested epitaxial layers 604-608 may have 'U' shapes of varying sizes that allow for an inner surface of a lower epitaxial layer 604 to abut an outer surface of an adjacent middle epitaxial layer 606. Such sizes allow for the middle epitaxial layer 606 to be nested or contained within the lower epitaxial layer 604.

The materials of the plurality of nested epitaxial layers 604-608 are selected to vary depending on a doping type of the well region 104. For example, in some embodiments, wherein a transistor device comprises a PMOS transistor, the lower epitaxial layer 604 is a silicon layer, the middle epitaxial layer 606 is a silicon carbide (SiC) layer, and the upper epitaxial layer 608 is an un-doped silicon germanium layer. In other embodiments, wherein a transistor device comprises an NMOS transistor, the lower epitaxial layer 604 is a silicon layer, the middle epitaxial layer 606 is a silicon carbide (SiC) layer, and the upper epitaxial layer 608 is an un-doped silicon layer. It will be appreciated that back diffusion of dopants from the well region 104 (e.g., during subsequent thermal processes) will cause the un-doped silicon and silicon germanium layers to form lightly doped silicon and silicon germanium layers, respectively.

Figure 7:
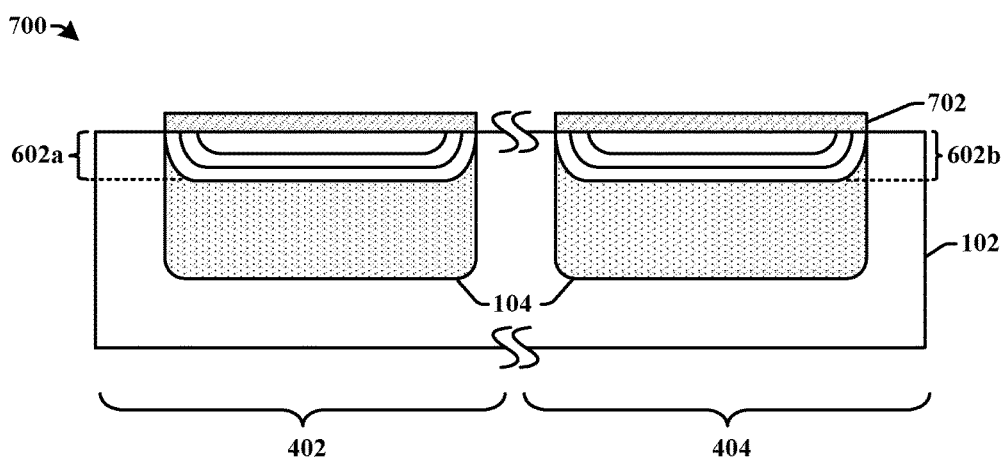

FIG. 7 illustrates a cross-sectional view 700 of some embodiments of a semiconductor substrate corresponding to act 314.

As shown in cross-sectional view 700, a gate dielectric layer 702 is selectively formed over the sandwich epitaxial film stacks 602. In some embodiments, the gate dielectric layer 702 may comprise an oxide layer formed by way of a vapor deposition technique, for example.

Figure 8:
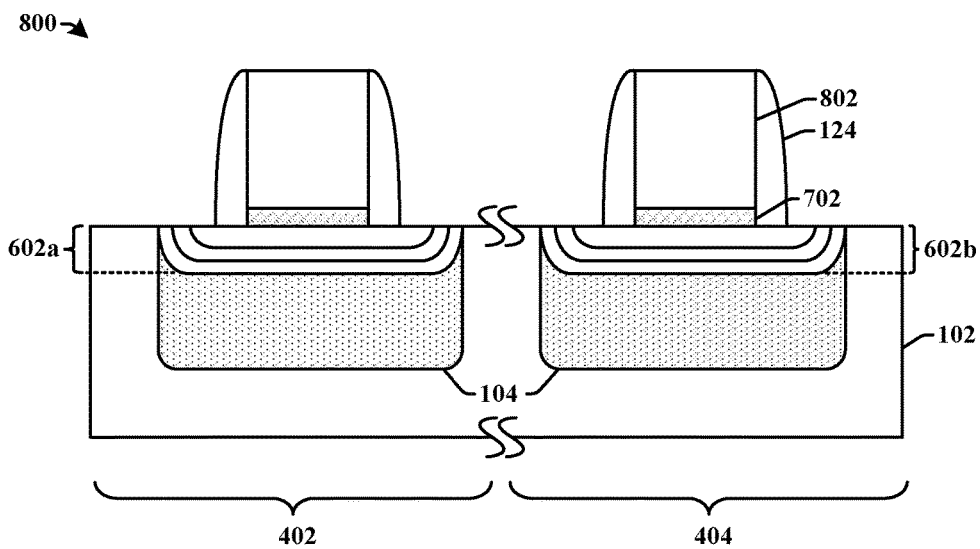

FIG. 8 illustrates a cross-sectional view 800 of some embodiments of a semiconductor substrate corresponding to act 316.

As shown in cross-sectional view 800, the gate dielectric layer 702 is patterned to remove a portion of the gate dielectric layer 702 from over the sandwich epitaxial film stacks 602. A dummy gate material 802 is then formed over the gate dielectric layer 702. The dummy gate material 802 may comprise a polysilicon layer deposited onto the gate dielectric layer 702 using a deposition technique (e.g., chemical vapor deposition, physical vapor deposition, etc.). In some embodiments, the dummy gate structure may further sidewall spacers 124 formed at positions flanking the dummy gate material 802. In some embodiments, the sidewall spacers 124 may be formed by depositing nitride and selectively etching the nitride to form the sidewall spacers 124.

Figure 9:
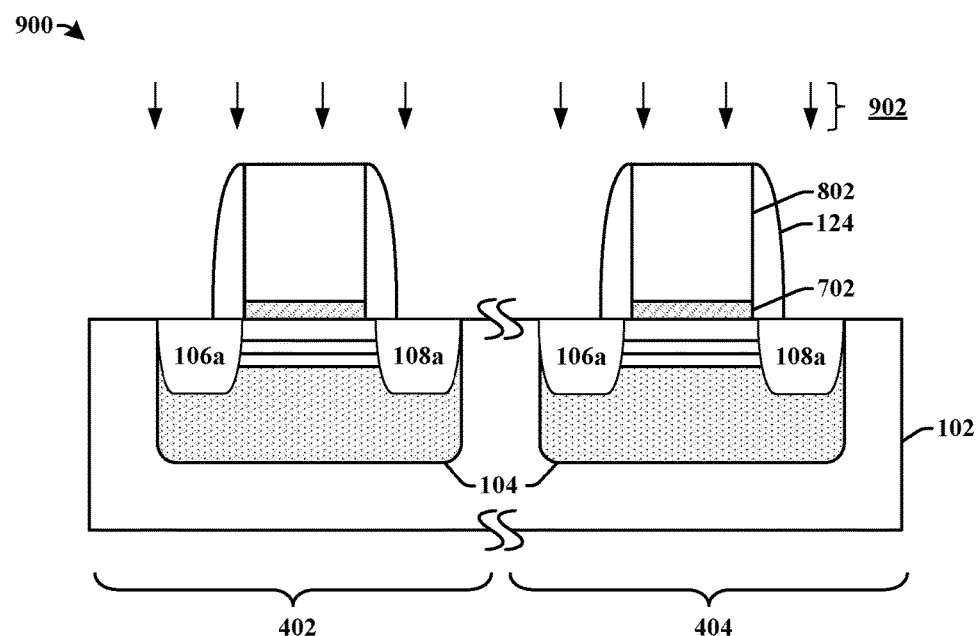

FIG. 9 illustrates a cross-sectional view 900 of some embodiments of a semiconductor substrate corresponding to act 318.

As shown in cross-sectional view 900, a source/drain implantation 902 is performed to form a source region 106 and a drain region 108 within the semiconductor substrate 102. The source and drain regions, 106 and 108, are located on opposing sides of the sandwich epitaxial film stacks 602.

In other embodiments, the source region 106 and the drain region 108 may be formed as epitaxial source and drain regions, as described above.

Figure 10:
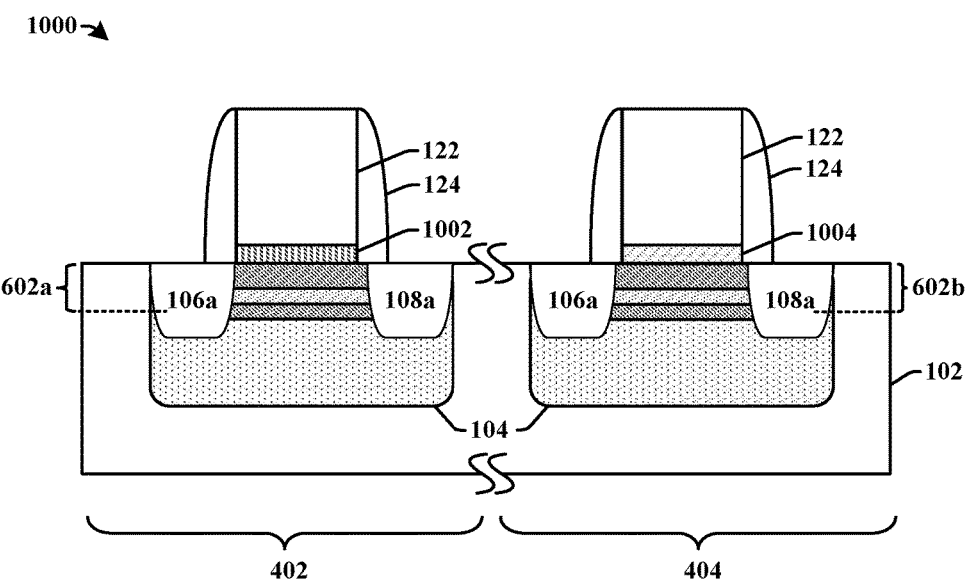

FIG. 10 illustrates a cross-sectional view 1000 of some embodiments of a semiconductor substrate corresponding to act 320.

As shown in cross-sectional view 1000, a replacement gate process is performed. In some embodiments, the replacement gate process may replace gate dielectric layer 702 with a gate dielectric layer 1002 comprising an inter-layer gate dielectric layer or a high-k gate dielectric layer. In some embodiments, transistor devices in the core region 402 may have a gate dielectric layer 1002 that is different than a gate dielectric layer of transistor devices in the periphery I/O region 404. The replacement gate process also removes the dummy gate material 802 and forms a gate electrode layer 122 comprising a replacement metal gate electrode layer over gate dielectric layer 1002/1004 using a deposition technique. In some embodiments, the replacement metal gate electrode layer may comprise aluminum, for example.

Therefore, the present disclosure relates to a transistor device having a sandwich film stack comprising a plurality of different layers, and an associated method of formation.

In some embodiments, the present disclosure relates to a transistor device. The transistor device comprises a source region and a drain region disposed within a semiconductor substrate. A sandwich film stack is laterally positioned between the source region and the drain region. The sandwich film stack comprises a lower layer, a middle layer of a carbon doped semiconductor material disposed over the lower layer, and an upper layer disposed over the middle layer. A gate structure is disposed over the sandwich film stack. The gate structure is configured to control a flow of charge carriers in a channel region located between the source region and the drain region.

In other embodiments, the present disclosure relates to a transistor device. The transistor device comprises a source region and a drain region disposed within a semiconductor substrate. A sandwich film stack is laterally positioned between the source region and the drain region. The sandwich film stack comprises a lower layer comprising silicon, a middle layer comprising silicon carbide disposed onto the lower layer, and an upper layer comprising silicon disposed onto the middle layer. A gate structure is disposed over the sandwich film stack.

In yet other embodiments, the present disclosure relates to an integrated chip. The integrated chip comprises first source and drain regions having a first doping type, which are disposed within an upper surface of a substrate on opposing sides of a first gate structure. A first sandwich film stack comprising a first plurality of stacked layers is arranged within a first recess in the upper surface of the substrate between the first source and drain regions. At least two of the first plurality of stacked layers comprise different materials. The integrated chip further comprises second source and drain regions having a second doping type different than the first doping type, which are disposed within the upper surface on opposing sides of a second gate structure. A second sandwich film stack comprising a second plurality of stacked layers is arranged within a second recess in the upper surface between the second source and drain regions. At least two of the second plurality of stacked layers comprise different materials. The first plurality of stacked layers is different than the second plurality of stacked layers. The first plurality of stacked layers and the second plurality of stacked layers have a same number of stacked layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor device, comprising: a source region and a drain region disposed within a semiconductor substrate; a sandwich film stack in direct contact with the semiconductor substrate and laterally positioned between the source region and the drain region, wherein the sandwich film stack comprises a lower layer, a middle layer of a carbon doped semiconductor material disposed over the lower layer, and an upper layer disposed over the middle layer; a gate structure disposed over the sandwich film stack; and wherein the middle layer is a silicon carbide (SiC) layer arranged between the lower layer and the upper layer.

2. The transistor device of claim 1,
wherein the sandwich film stack comprises a first set of materials in an NMOS transistor device;
wherein the sandwich film stack comprises a second set of materials different than the first set of materials in a PMOS transistor device; and
wherein the first set of materials and the second set of materials have a same number of stacked layers.

3. The transistor device of claim 1, wherein the lower layer is a first silicon layer.

4. The transistor device of claim 1, wherein the upper layer is a second silicon layer.

5. The transistor device of claim 1, wherein the upper layer is a silicon germanium layer.

6. The transistor device of claim 1,
wherein the gate structure comprises a gate dielectric layer and an overlying gate electrode; and
wherein the upper layer laterally extends past outermost sidewalls of the gate dielectric layer.

7. The transistor device of claim 1, wherein the sandwich film stack is arranged within a recess in the semiconductor substrate between the source region and the drain region.

8. The transistor device of claim 7,
wherein the lower layer directly contacts a bottom surface of the recess;
wherein a lower surface of the middle layer directly contacts an upper surface of the lower layer; and
wherein an upper surface of the middle layer directly contacts a lower surface of the upper layer.

9. The transistor device of claim 1, wherein the lower layer has a bottommost boundary that is above bottommost boundaries of the source region and the drain region.

10. The transistor device of claim 1, wherein the lower layer has an upper surface that directly contacts the middle layer and a lower surface that directly contacts the semiconductor substrate.

11. The transistor device of claim 10, wherein the upper layer has a lower surface that directly contacts the middle layer and an upper surface that directly contacts the gate structure.

12. A transistor device, comprising:
a source region and a drain region disposed within a semiconductor substrate;
an epitaxial sandwich film stack directly contacting the semiconductor substrate and laterally positioned between the source region and the drain region, wherein the epitaxial sandwich film stack comprises a middle layer that is a carbon containing semiconductor material having a first side directly contacting a first silicon (Si) layer and an opposing second side directly contacting a second (Si) silicon layer; and
a gate structure disposed over the epitaxial sandwich film stack.

13. The transistor device of claim 12, wherein the first silicon (Si) layer directly contacts the gate structure and the second silicon (Si) layer directly contacts the semiconductor substrate.

14. The transistor device of claim 12, wherein the carbon containing semiconductor material, the first silicon (Si) layer, and the second silicon (Si) layer laterally contact the source region and the drain region.

15. The transistor device of claim 12, wherein the carbon containing semiconductor material completely separates the first silicon (Si) layer from the second silicon (Si) layer.

16. An integrated chip, comprising:
first source and drain regions having a first doping type, which are disposed within an upper surface of a substrate on opposing sides of a first gate structure;
a first epitaxial sandwich film stack comprising a first plurality of stacked layers within a first recess in the upper surface of the substrate between the first source and drain regions, wherein at least two of the first plurality of stacked layers comprise different materials;
second source and drain regions having a second doping type different than the first doping type, which are disposed within the upper surface on opposing sides of a second gate structure;
a second epitaxial sandwich film stack comprising a second plurality of stacked layers within a second recess in the upper surface between the second source and drain regions, wherein at least two of the second plurality of stacked layers comprise different materials and wherein the first plurality of stacked layers is different than the second plurality of stacked layers; and
wherein the first plurality of stacked layers and the second plurality of stacked layers have a same number of stacked layers and wherein the first plurality of stacked layers and the second plurality of stacked layers respectively comprise a middle layer that is a silicon carbide (SiC) layer arranged between a lower layer and an upper layer.

17. The integrated chip of claim 16, wherein the first plurality of stacked layers and the second plurality of stacked layers have three stacked layers.

18. The integrated chip of claim 16, wherein a bottom surface of the first epitaxial sandwich film stack is above bottom surfaces of the first source and drain regions.

19. The integrated chip of claim 16, wherein the silicon carbide (SiC) layer is arranged between a lower silicon layer and the upper layer.

20. The integrated chip of claim 19,
wherein the first plurality of stacked layers comprise a first upper layer that is a silicon layer; and
wherein the second plurality of stacked layers comprise a second upper layer that is a silicon germanium layer.

* * * * *